US010437817B2

(12) United States Patent
Hirsch et al.

(10) Patent No.: US 10,437,817 B2
(45) Date of Patent: Oct. 8, 2019

(54) CONCURRENT SEGMENTATION USING VECTOR PROCESSING

(71) Applicant: Huawei Technologies Co., Ltd., Shenzhen (CN)

(72) Inventors: Michael Hirsch, Munich (DE); Yair Toaff, Munich (DE); Yehonatan David, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/113,151

(22) Filed: Aug. 27, 2018

(65) Prior Publication Data

US 2018/0365284 A1 Dec. 20, 2018

Related U.S. Application Data

(63) Continuation of application No. PCT/EP2016/058671, filed on Apr. 19, 2016.

(51) Int. Cl.
*G06F 16/20* (2019.01)
*G06F 16/23* (2019.01)
(Continued)

(52) U.S. Cl.
CPC ......... *G06F 16/2365* (2019.01); *G06F 16/27* (2019.01); *H03M 7/3091* (2013.01)

(58) Field of Classification Search
None
See application file for complete search history.

(56) References Cited

U.S. PATENT DOCUMENTS 5,990,810 A 11/1999 Williams
6,704,730 B2 3/2004 Moulton et al.
(Continued)

FOREIGN PATENT DOCUMENTS

CN 101167127 A 4/2008
CN 102722583 A 10/2012
(Continued)

OTHER PUBLICATIONS

"Optimizing Rolling Hash computation using SIMD Vector registers," XP 002763854, pp. 1-3, (2013).
(Continued)

*Primary Examiner* — Belix M Ortiz Ditren
(74) *Attorney, Agent, or Firm* — Leydig, Voit & Mayer, Ltd.

(57) ABSTRACT

A system for segmenting an input data stream, comprising a processor adapted to split an input data stream to a plurality of data sub-streams such that each of the plurality of data sub-streams has an overlapping portion with a consecutive data sub-stream of the plurality of data sub-streams, create concurrently a plurality of segmented data sub-streams by concurrently segmenting the plurality of data sub-streams each in one of a plurality of processing pipelines of the processor and join the plurality of segmented data sub-streams to create a segmented data stream by synchronizing a sequencing of each of the plurality of segmented data sub-streams according to one or more overlapping segments in the overlapping portion of each two consecutive data sub-streams of the plurality of data sub-streams.

18 Claims, 11 Drawing Sheets

(51) Int. Cl.
*G06F 16/27* (2019.01)
*H03M 7/30* (2006.01)

(56) References Cited

U.S. PATENT DOCUMENTS

| | | | |
|---|---|---|---|
| 7,143,091 | B2 | 11/2006 | Charnock et al. |
| 8,024,317 | B2 | 9/2011 | Nair et al. |
| 8,032,508 | B2 | 10/2011 | Martinez et al. |
| 8,060,492 | B2 | 11/2011 | Nair et al. |
| 8,299,944 | B2 | 10/2012 | Provenzano |
| D676,167 | S | 2/2013 | Ching-Tsung |
| 8,396,905 | B2 | 3/2013 | Provenzano |
| 8,402,004 | B2 | 3/2013 | Provenzano et al. |
| 8,407,428 | B2 | 3/2013 | Cheriton et al. |
| D680,519 | S | 4/2013 | Ito |
| 8,417,674 | B2 | 4/2013 | Provenzano |
| 8,504,791 | B2 | 8/2013 | Cheriton et al. |
| 8,601,222 | B2 | 12/2013 | Flynn et al. |
| 8,688,650 | B2 | 4/2014 | Mutalik et al. |
| 8,726,331 | B2 * | 5/2014 | Ngo .................. H04N 7/17336 |
| | | | 725/101 |
| 8,788,769 | B2 | 7/2014 | Abercrombie et al. |
| 8,843,489 | B2 | 9/2014 | Provenzano |
| 8,849,759 | B2 | 9/2014 | Bestler et al. |
| 8,874,863 | B2 | 10/2014 | Mutalik et al. |
| 8,904,126 | B2 | 12/2014 | Ashutosh et al. |
| 8,935,506 | B1 | 1/2015 | Gopalan |
| 8,965,854 | B2 | 2/2015 | Provenzano et al. |
| 8,966,191 | B2 | 2/2015 | Flynn et al. |
| 8,983,915 | B2 | 3/2015 | Mutalik et al. |
| 9,015,425 | B2 | 4/2015 | Flynn et al. |
| 9,075,710 | B2 | 7/2015 | Talagala et al. |
| 9,076,599 | B2 | 7/2015 | Endo et al. |
| D737,528 | S | 8/2015 | Dammkoehler |
| 9,157,876 | B2 | 10/2015 | Halderman et al. |
| 9,244,967 | B2 | 1/2016 | Provenzano et al. |
| 9,250,817 | B2 | 2/2016 | Flynn et al. |
| 9,251,062 | B2 | 2/2016 | Flynn et al. |
| 9,251,198 | B2 | 2/2016 | Mutalik et al. |
| 9,256,368 | B2 | 2/2016 | Welnicki et al. |
| 9,323,465 | B2 | 4/2016 | Flynn et al. |
| D756,678 | S | 5/2016 | Rawls-Meehan |
| 9,372,758 | B2 | 6/2016 | Ashutosh et al. |
| 9,372,866 | B2 | 6/2016 | Provenzano |
| 9,380,351 | B2 * | 6/2016 | Zhao .................. H04N 21/631 |
| 9,384,207 | B2 | 7/2016 | Provenzano et al. |
| 9,384,254 | B2 | 7/2016 | Tekade et al. |
| 9,400,987 | B2 | 7/2016 | Nair et al. |
| 9,424,184 | B2 | 8/2016 | Flynn et al. |
| 9,495,435 | B2 | 11/2016 | Zhang et al. |
| 9,501,545 | B2 | 11/2016 | Woodward et al. |
| 9,501,546 | B2 | 11/2016 | Bhargava et al. |
| 9,548,908 | B2 | 1/2017 | Nguyen et al. |
| 9,563,555 | B2 | 2/2017 | Flynn et al. |
| 9,563,683 | B2 | 2/2017 | Abercrombie et al. |
| 9,646,067 | B2 | 5/2017 | Abercrombie et al. |
| 9,659,077 | B2 | 5/2017 | Chen et al. |
| 9,665,304 | B2 | 5/2017 | Iwanicki et al. |
| 9,665,437 | B2 | 5/2017 | Bhargava et al. |
| 9,754,005 | B2 | 9/2017 | Potter et al. |
| 9,772,916 | B2 | 9/2017 | Rangasamy |
| 2006/0247928 | A1 | 11/2006 | Cowdery |
| 2006/0253418 | A1 | 11/2006 | Charnock et al. |
| 2007/0116117 | A1 * | 5/2007 | Tong .................. H04N 19/172 |
| | | | 375/240.08 |
| 2010/0125569 | A1 | 5/2010 | Nair et al. |
| 2010/0125605 | A1 | 5/2010 | Nair et al. |
| 2012/0123999 | A1 | 5/2012 | Ashutosh et al. |
| 2013/0087297 | A1 | 4/2013 | Wolin |
| 2014/0006858 | A1 | 1/2014 | Helfman et al. |
| 2014/0015309 | A1 | 1/2014 | Mayer et al. |
| 2015/0019510 | A1 * | 1/2015 | Aronovich ........ G06F 17/30159 |
| | | | 707/692 |
| 2015/0019556 | A1 | 1/2015 | Provenzano |
| 2015/0019833 | A1 * | 1/2015 | Aronovich ............ G06F 12/023 |
| | | | 711/171 |
| 2015/0106580 | A1 | 4/2015 | Abercrombie et al. |
| 2015/0142745 | A1 | 5/2015 | Tekade et al. |
| 2015/0142748 | A1 | 5/2015 | Gottemukkula et al. |
| 2015/0142750 | A1 | 5/2015 | Mutalik et al. |
| 2015/0143063 | A1 | 5/2015 | Mutalik et al. |
| 2015/0161194 | A1 | 6/2015 | Provenzano et al. |
| 2015/0178347 | A1 | 6/2015 | Mutalik et al. |
| 2015/0227600 | A1 | 8/2015 | Ramu et al. |
| 2015/0227601 | A1 | 8/2015 | Ramu et al. |
| 2015/0227602 | A1 | 8/2015 | Ramu et al. |
| 2015/0227890 | A1 | 8/2015 | Bednarek et al. |
| 2015/0228004 | A1 | 8/2015 | Bednarek et al. |
| 2015/0286443 | A1 | 10/2015 | Aronovich et al. |
| 2015/0356134 | A1 | 12/2015 | Hayasaka et al. |
| 2016/0070714 | A1 | 3/2016 | D'Sa et al. |
| 2016/0077926 | A1 | 3/2016 | Mutalik et al. |
| 2016/0092552 | A1 | 3/2016 | Morfonios et al. |
| 2016/0132523 | A1 | 5/2016 | Traeger |
| 2016/0140004 | A1 | 5/2016 | Flynn et al. |
| 2017/0011120 | A1 * | 1/2017 | Cheung ............ G06F 17/30628 |
| 2017/0068751 | A1 | 3/2017 | Bulusu et al. |

FOREIGN PATENT DOCUMENTS

| | | |
|---|---|---|
| CN | 103814361 A | 5/2014 |
| JP | 2011003975 A | 1/2011 |
| WO | 2004017524 A1 | 2/2004 |
| WO | 2014184857 A1 | 11/2014 |

OTHER PUBLICATIONS

Zhu "Avoiding the Disk Bottleneck in the Data Domain Deduplication File System", (2008).

"Data Domain Files IPO, Cuts Deal with Quantum," Science X Network, Phys.org (Mar. 31, 2007).

Bhagwat et al., "Extreme Binning: Scalable, Parallel Deduplication for Chunk-based File Backup", Modeling, Analysis and Simulation of Computer and Telecommunication Systems, 2009. Mascots '09. IEEE International Symposium on, IEEE, Piscataway, NJ, USA, Sep. 21, 2009, pp. 1-9.

* cited by examiner

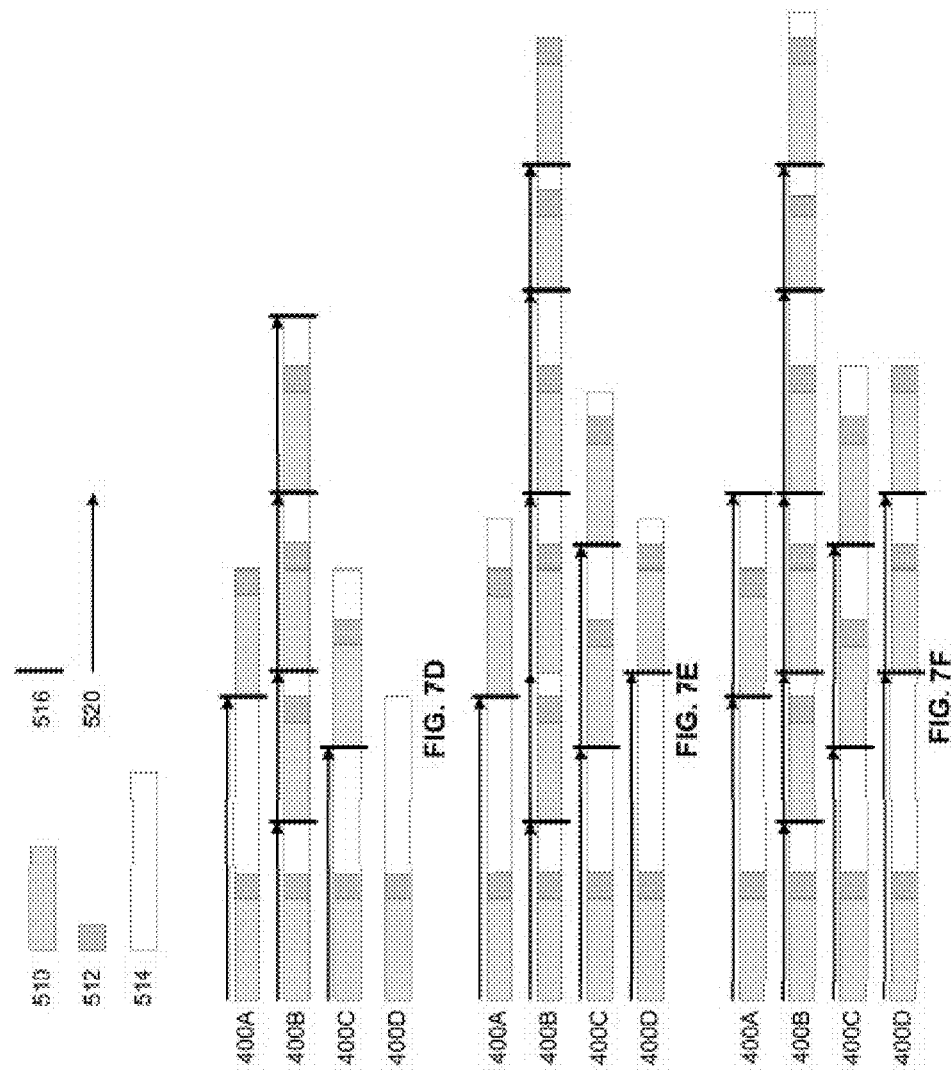

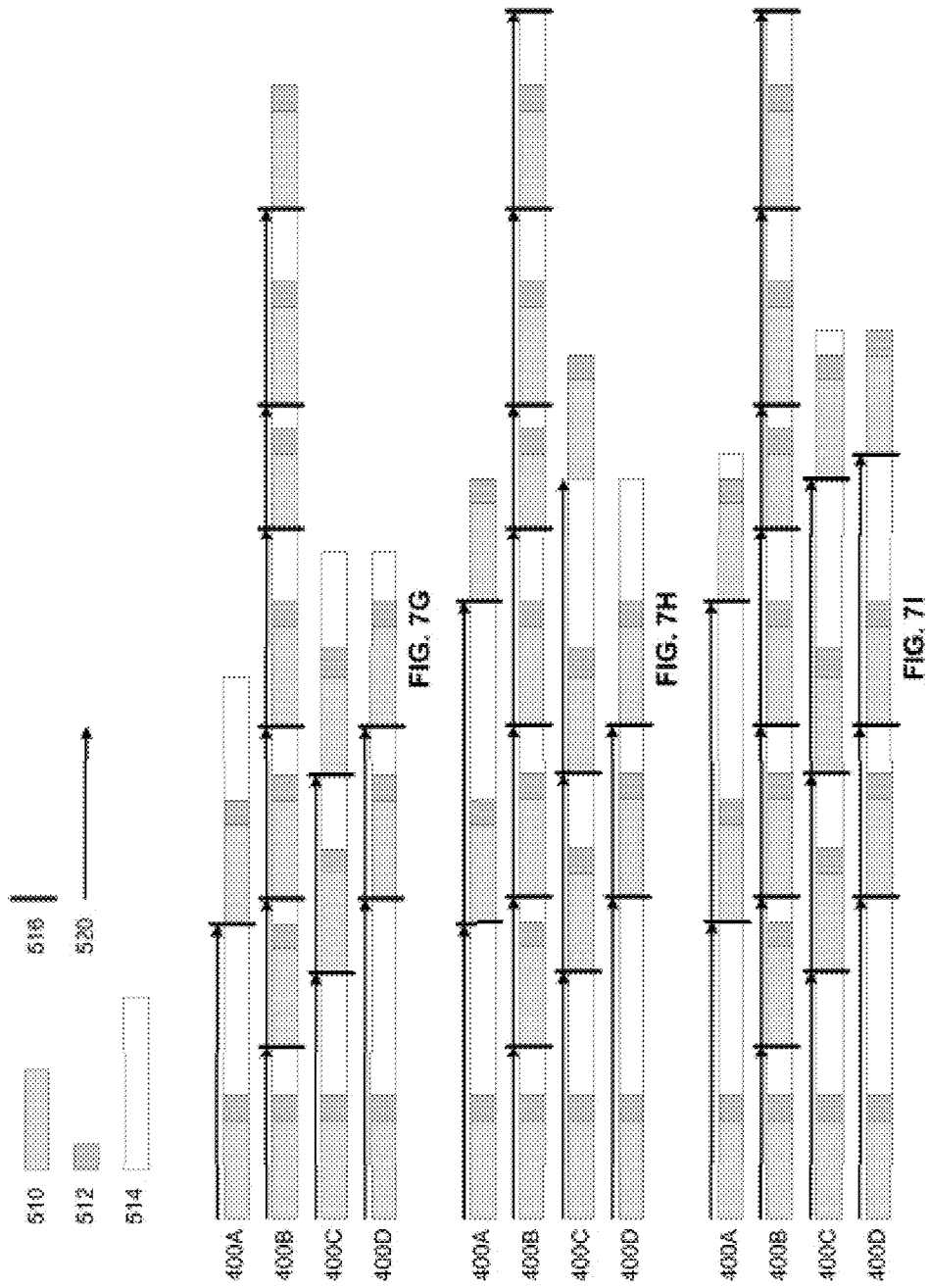

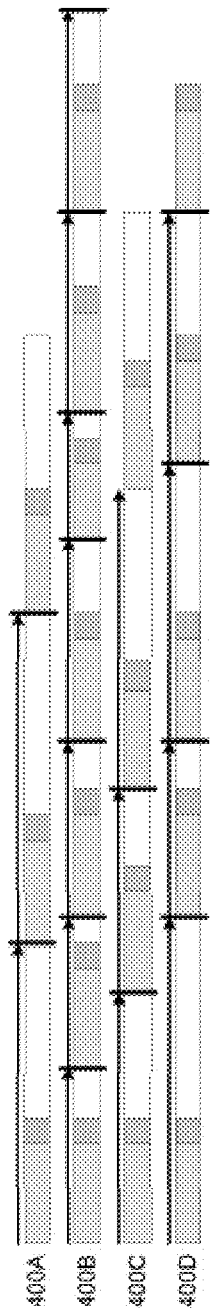
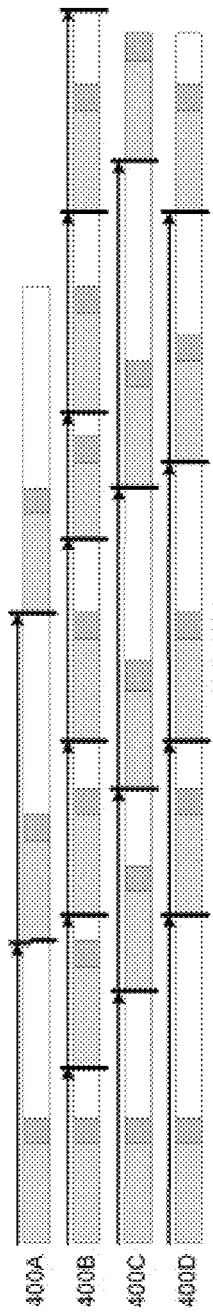
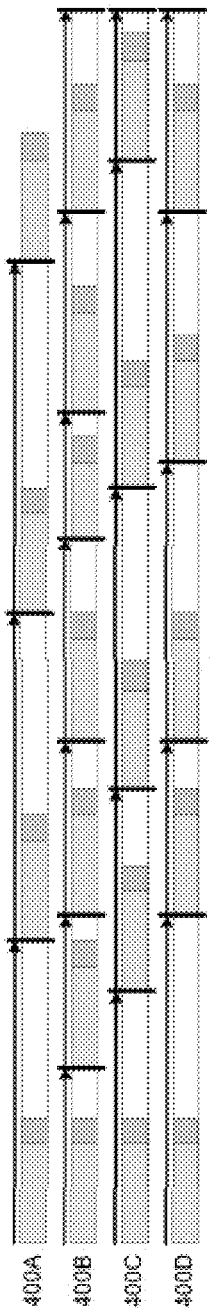
FIG. 7J
FIG. 7K
FIG. 7L

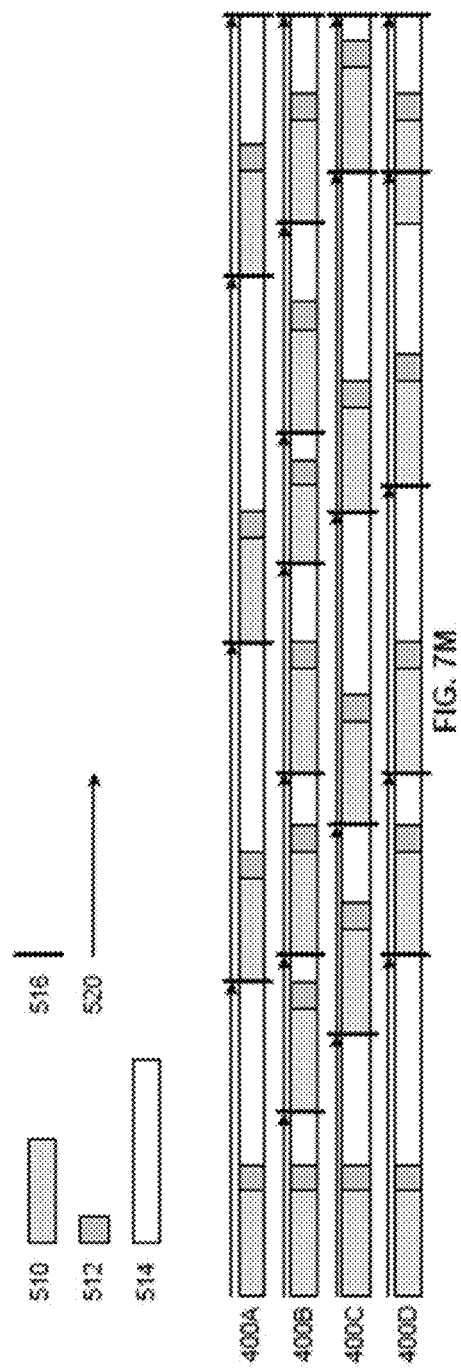

CONCURRENT SEGMENTATION USING VECTOR PROCESSING

CROSS-REFERENCE TO RELATED APPLICATIONS

This application is a continuation of International Application No. PCT/EP2016/058671, filed on Apr. 19, 2016, the disclosure of which is hereby incorporated by reference in its entirety.

BACKGROUND

The present disclosure, in some embodiments thereof, relates to segmenting an input data stream and, more specifically, but not exclusively, to segmenting an input data stream by splitting the input data stream to a plurality of data sub-streams segmented in parallel using vector processing.

In present times being an information era, the volumes of data which need to be stored and/or transferred between locations rapidly increase. The enormous quantities of data may present major cost and/or complexity challenges with respect to storage space for storing the data and/or network bandwidth for transferring it.

One solution commonly used for reducing the amount of data for storage and/or transfer is data deduplication (often called "intelligent compression" or "single-instance storage") which is a method of reducing the data volume by eliminating redundant data. While there are methods for file deduplication, block deduplication may present better results with respect to data compression. In block deduplication only one unique instance of a data segment (block) of a data stream is actually retained while redundant data segment(s) which are identical to the already retained data segment are replaced with a pointer to a copy of the retained data segment. Block deduplication processes a data stream that may include multiple data types, for example, data files, media files, stream data and the like to identify unique instances of one or more data segments (blocks). A unique number (hash value) is generated for each segment using a hash algorithm, for example, a Rabin-Karp rolling hash and/or a Buzhash. The hash value generated for each segment is compared to existing hash values generated for previous segments and in case the hash value equals to an existing hash value, the segment is not retained but rather replaced with a pointer to the copy of the existing segment. Furthermore, in case the segment is updated, only the changed data may be retained while the remaining unchanged data which may include a significant amount of the segment is not retained.

One of the main challenges is effectively segmenting the data stream such that the segments are affected as little as possible by changes to the segments' data contents. Rolling hash techniques may be used for segmenting the data stream as known in the industry. Using a rolling hash, a hash value is calculated for shifting sequences of data in the data stream (in each rolling sequence an ending data item is omitted and a new data item is inserted). The calculated hash value is checked for compliance with pre-defined one or more segmentation criteria and in case the compliance is identified, the start of the respective rolling sequence is designated as a segment boundary or cut point.

SUMMARY

According to a first aspect of the present disclosure there is provided a system for segmenting an input data stream, comprising a processor adapted to split an input data stream to a plurality of data sub-streams such that each of the plurality of data sub-streams has an overlapping portion with a consecutive data sub-stream of the plurality of data sub-streams; create, concurrently, a plurality of segmented data sub-streams by concurrently segmenting the plurality of data sub-streams each in one of a plurality of processing pipelines of the processor; and join the plurality of segmented data sub-streams to create a segmented data stream by synchronizing a sequencing of each of the plurality of segmented data sub-streams according to at least one overlapping segment in the overlapping portion of each two consecutive data sub-streams of the plurality of data sub-streams.

The term concurrent has thereby the meaning of overlapping in duration also including the meaning of simultaneous, e.g. happening at the same time.

According to a first implementation form of the first aspect of the present disclosure as such the processor is a single-instruction-multiple-data, SIMD, processor.

According to a second implementation form of the first aspect as such or according to the first implementation form of the first aspect the processor is adapted to segment each of the plurality of data sub-streams by calculating a rolling hash value for a rolling sequence applied over each of a plurality of sequences of consecutive data items of each of the plurality of data sub-streams and designating each of the plurality of sequences as a variable size segment when the rolling hash value complies with at least one segmentation criterion, wherein the rolling sequence comprises a subset of consecutive data items of a respective sequence.

According to a third implementation form of the first aspect as such or according to any of the first or second implementation form of the first aspect each of the plurality of sequences includes a pre-defined minimum number of the consecutive data items.

According to a fourth implementation form of the first aspect as such or according to any of the first to third implementation form of the first aspect the processor is adapted to designate at least one large sequence of the plurality of sequences as the variable size segment in case a number of the consecutive data items of the at least one large sequence exceeds a pre-defined maximum value before detecting compliance of the rolling hash value with the at least one segmentation criterion.

According to a fifth implementation form of the first aspect as such or according to any of the first to fourth implementation form the processor is adapted to sequentially segment the input data stream in case the synchronization fails.

According to a second aspect of the present disclosure there is provided a method for segmenting an input data stream, comprising splitting an input data stream to a plurality of data sub-streams such that each of the plurality of data sub-streams has an overlapping portion with a consecutive data sub-stream of the plurality of data sub-streams; creating, concurrently, a plurality of segmented data sub-streams by concurrently segmenting the plurality of data sub-streams each in one of a plurality of processing pipelines of the processor; and joining the plurality of segmented data sub-streams to create a segmented data stream by synchronizing a sequencing of each of the plurality of segmented data sub-streams according to at least one overlapping segment in the overlapping portion of each two consecutive data sub-streams of the plurality of data sub-streams.

According to a first implementation form of the second aspect of the present disclosure as such each of the plurality of data sub-streams is segmented by calculating a rolling hash value for a rolling sequence applied over each of a plurality of sequences of consecutive data items of each of the plurality of data sub-streams and designating each of the plurality of sequences as a variable size segment when the rolling hash value complies with at least one segmentation criterion, wherein the rolling sequence comprises a subset of consecutive data items of a respective sequence.

According to a second implementation form of the second aspect as such or according to the first implementation form of the second aspect each of the plurality of sequences includes a pre-defined minimum number of the consecutive data items.

According to a third implementation form of the second aspect as such or according to any of the first or second implementation form of the second aspect at least one large sequence of the plurality of sequences is designated as the variable size segment in case a number of the consecutive data items of the at least one large sequence exceeds a pre-defined maximum value before detecting compliance of the rolling hash value with the at least one segmentation criterion.

According to a fourth implementation form of the second aspect as such or according to any of the first to third implementation form of the second aspect the input data stream is sequentially segmented in case the synchronization fails.

BRIEF DESCRIPTION OF THE SEVERAL VIEWS OF THE DRAWINGS

Some embodiments of the disclosure are herein described, by way of example only, with reference to the accompanying drawings. With specific reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

In the drawings:

FIG. 7D is a schematic illustration of an exemplary process for concurrently segmenting in parallel a plurality of data sub-streams at a 4th point in time, according to some embodiment of the present disclosure;

FIG. 7E is a schematic illustration of an exemplary process for concurrently segmenting in parallel a plurality of data sub-streams at a 5th point in time, according to some embodiment of the present disclosure;

FIG. 7F is a schematic illustration of an exemplary process for concurrently segmenting in parallel a plurality of data sub-streams at a 6th point in time, according to some embodiment of the present disclosure;

FIG. 7G is a schematic illustration of an exemplary process for concurrently segmenting in parallel a plurality of data sub-streams at a 7th point in time, according to some embodiment of the present disclosure;

FIG. 7H is a schematic illustration of an exemplary process for concurrently segmenting in parallel a plurality of data sub-streams at an 8th point in time, according to some embodiment of the present disclosure;

FIG. 7I is a schematic illustration of an exemplary process for concurrently segmenting in parallel a plurality of data sub-streams at a 9th point in time, according to some embodiment of the present disclosure;

FIG. 7J is a schematic illustration of an exemplary process for concurrently segmenting in parallel a plurality of data sub-streams at a 10th point in time, according to some embodiment of the present disclosure;

FIG. 7K is a schematic illustration of an exemplary process for concurrently segmenting in parallel a plurality of data sub-streams at an 11th fifth point in time, according to some embodiment of the present disclosure;

FIG. 7L is a schematic illustration of an exemplary process for concurrently segmenting in parallel a plurality of data sub-streams at a 12th point in time, according to some embodiment of the present disclosure; and FIG. 7M is a schematic illustration of an exemplary process for concurrently segmenting in parallel a plurality of data sub-streams at a 13th point in time, according to some embodiment of the present disclosure.

DETAILED DESCRIPTION

Figure 1:
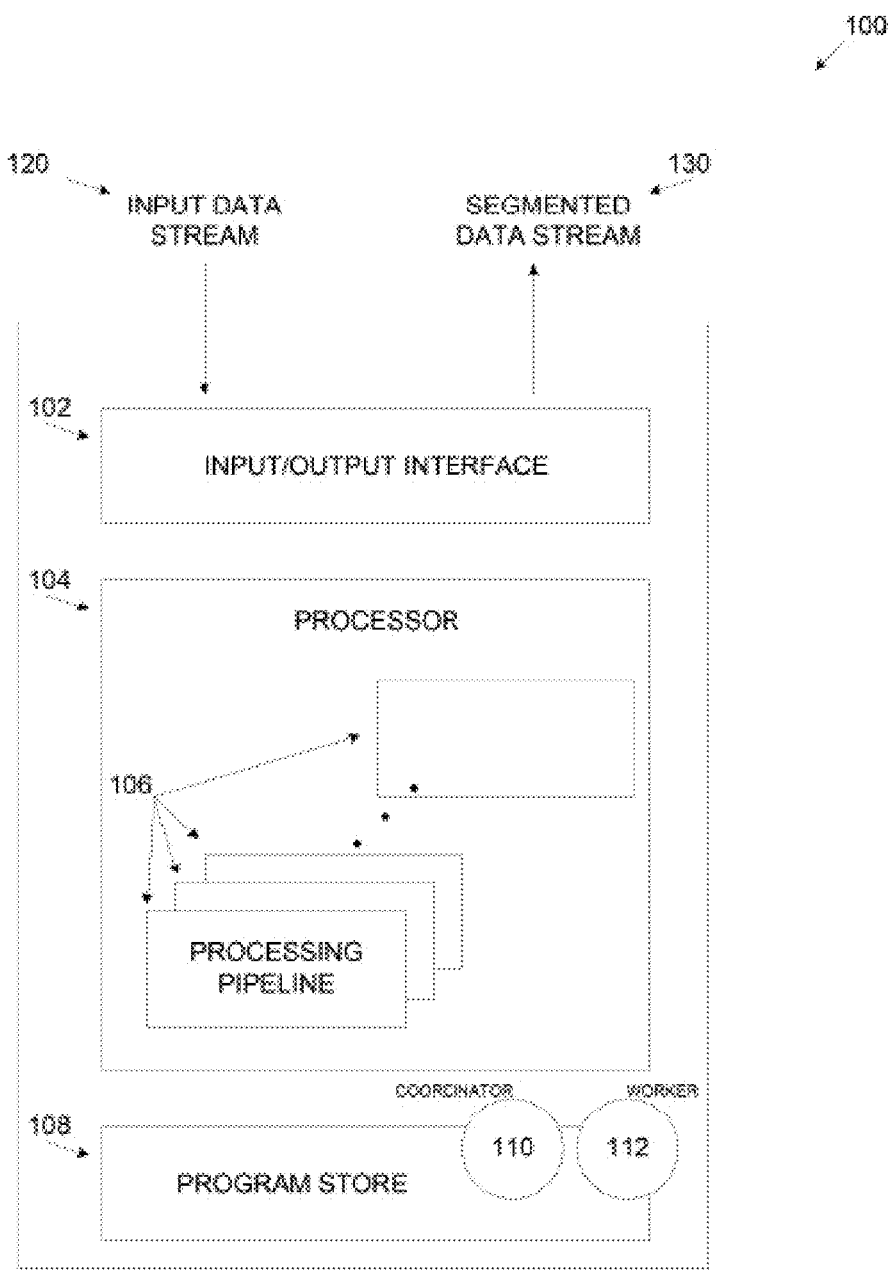
FIG. 1 is a schematic illustration of an exemplary system for segmenting an input data stream by splitting the input data stream to a plurality of data sub-streams segmented in parallel using vector processing, according to some embodiments of the present disclosure.

The present disclosure, in some embodiments thereof, relates to segmenting an input data stream and, more specifically, but not exclusively, to segmenting an input data stream by splitting the input data stream to a plurality of data sub-streams segmented in parallel using vector processing.

The present disclosure presents systems and methods for segmenting an input data stream using vector processing as part of a deduplication process applied to the input data stream in order to reduce the amount of data of the input data stream for example, data files, media files, streaming data and the like by removing redundant (duplicated) data segments. The deduplication process for reducing the amount of data of the input data stream is performed in order to reduce storage space and/or network bandwidth required for storing and/or transferring the input data stream. The segmentation is done by splitting the input data stream to a plurality of data sub-streams, segmenting the data sub-streams in parallel each by one of a plurality of processing pipelines of vector processor(s) for example a single instruction multiple data (SIMD) processor and joining the segmented data sub-streams to form a segmented data stream. The input-data stream is split to the plurality of data sub-streams such that each data sub-stream has an overlapping portion of data with a subsequent data sub-stream. After segmentation of all the data sub-streams is complete, the data sub-streams are joined to each other by synchronizing the data segments (blocks) in the overlapping portions between every two data sub-streams. Since the same segmentation technique and/or segmentation criteria is applied to the data sub-streams by the processing pipelines, it is expected that the segmentation in the overlapping portions is identical and therefore may be used for synchronizing the data sub-streams to each other. The segmentation of each of the data sub-streams may be done using one or more of a plurality of segmentation techniques, for example, calculating a unique hash value for a rolling sequence shifted along the data sub-stream and comparing the hash value to one or more segmentation criteria. The hash value may be calculated by one or more of a plurality of hash algorithms, for example, a Rabin-Karp rolling hash or a Buzhash.

Optionally, the input data stream is segmented serially in the event the synchronization of one or more of the data sub-streams fails.

Concurrent segmentation using the plurality of processing pipelines of the vector processing architecture may present significant advantages compared to existing sequential segmentation methods. The vector processing technology is rapidly advancing in many aspects, for example, number of processing pipelines available in modern processors, number of data items that may be processed in parallel and/or processing power of the processor(s). While efficient segmentation of the input data stream may have a major contribution to the effectivity of the entire deduplication process it may be one of the major time consuming and/or processor intensive operations of the deduplication process. Since the data items of the input sequence may be regarded as independent from each other, the input data stream may be split and processed in parallel taking full advantage of the vector processing technology, for example, the SIMD processor(s) and/or engine(s). Processing the input data stream using the vector processor(s) may significantly reduce the segmentation time compared to the sequential segmentation employed by current segmentation methods. As segmentation time is significantly reduced, the entire deduplication process may be significantly shortened and may possibly remove bottlenecks in data transfer and/or data storage operations.

Furthermore, the concurrent segmentation using the plurality of processing pipelines of the vector processing architecture applies standard segmentation techniques which are used by the existing sequential segmentation methods. This may allow backward compliance in the segmentation process thus no impact is inflicted to the other operations and/or algorithms applied during the deduplication process. Moreover, the backward compliance of the segmentation techniques used by the concurrent segmentation process presented in the present disclosure may allow coupling the concurrent segmentation process with sequential segmentation process(es) such that some portions of the input data stream are processed concurrently while other portions may be processed sequentially.

Before explaining at least one embodiment of the disclosure in detail, it is to be understood that the disclosure is not necessarily limited in its application to the details of construction and the arrangement of the components and/or methods set forth in the following description and/or illustrated in the drawings and/or the Examples. The disclosure is capable of other embodiments or of being practiced or carried out in various ways.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Computer readable program instructions described herein can be downloaded to respective computing/processing devices from a computer readable storage medium or to an external computer or external storage device via a network, for example, the Internet, a local area network, a wide area network and/or a wireless network.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference is now made to FIG. 1, which is a schematic illustration of an exemplary system for segmenting an input data stream by splitting the input data stream to a plurality of data sub-streams segmented in parallel using vector processing, according to some embodiments of the present disclosure. A system 100 includes an input/output (I/O) interface 102 for receiving and/or designating an input data stream 120 and/or outputting a segmented data stream 130, a processor(s) 104 comprising a plurality of processing pipelines 106 for segmenting the input data stream 120 to create the segmented data stream 130 and a program store 108. The input data stream 120 may be received in one or more formats, for example, a data file, a media file, a streaming data and the like. The input data stream 120 includes a plurality of data items, for example, bytes, words, double-words and/or pixels which may be arranged in sequence as a stream. The I/O interface 102 may include one or more interfaces, for example, a network interface, a memory interface and/or a storage interface. The I/O interface 102 may be used, for example, for receiving and/or transmitting the data streams 120 and/or 130 over a network, for fetching and/or storing the data streams 120 and/or 130 to a memory device and/or a storage device and the like. The processor(s) 104 may include one or more processors each having one or more cores. The processor(s) 104 further includes vector processing capabilities such as the plurality of processing pipelines 106. The processing pipelines 106 support multiple independent execution pipelines each capable of processing data, for example, multiple processors, multiple cores, vector processors, and/or SIMD processor and/or a SIMD engine. The SIMD engine comprises a plurality of processing pipelines 106 capable of concurrently processing multiple data items at a single instruction of the processor(s) 104. The program store 108 may include one or more non-transitory persistent storage devices, for example, a hard drive, a Flash array and the like.

Figure 2:
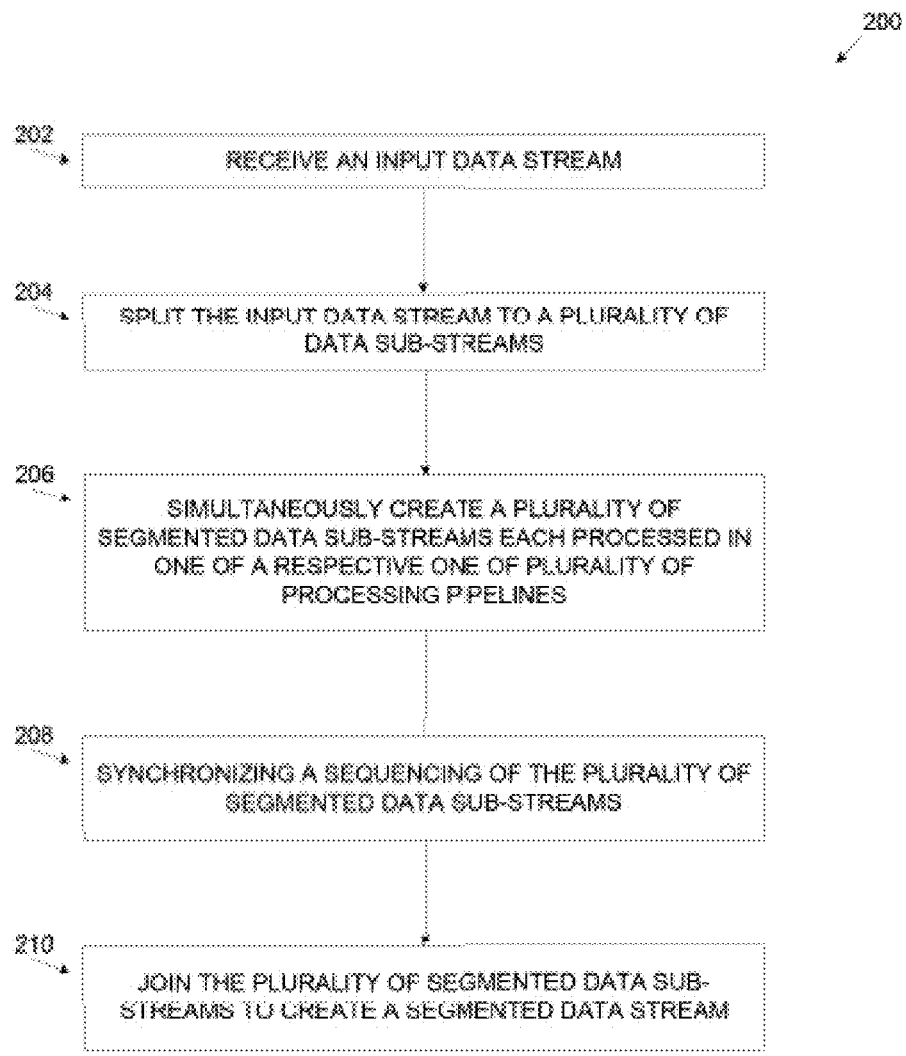
FIG. 2 is a flowchart of an exemplary process for segmenting an input data stream by splitting the input data stream to a plurality of data sub-streams segmented in parallel using vector processing, according to some embodiments of the present disclosure.

Reference is also made to FIG. 2, which is a flowchart of an exemplary process for segmenting an input data stream by splitting the input data stream to a plurality of data sub-streams segmented in parallel using vector processing, according to some embodiments of the present disclosure. A segmentation process 200 may be performed by a system such as the system 100. The process 200 is applied for segmenting the input data stream 120 by splitting the input data stream 120 to a plurality of data sub-streams that are concurrently segmented in parallel by the plurality of processing pipelines 106 and joined to create a segmented data stream such as the segmented data stream 130.

The segmentation process 200 may be done by one or more software modules, for example, a coordinator 110 and/or a worker 112 comprising a plurality of program instructions executed by the processor(s) 104 and/or the processing pipelines 106 from the program store 108. Optionally, the workers 112 may include one or more microcode modules embedded with the processing pipelines 106, where the microcode modules include program instructions executed by the processing pipelines 106. The coordinator 110 may be executed, for example, by a processing unit of the processor(s) 104. The coordinator 110 may manage and/or coordinate the segmentation process, for example, distribute data between the plurality of processing pipelines 106, collect data from the plurality of processing pipelines 106, synchronize data, synchronize tasks, coordinates the workers 112 and/or the like. The processor(s) 104 and/or each of the processing pipelines 106 may execute an instance of the worker 112 to process concurrently the data sub-streams of the input data stream 120. In case the processor(s) 104 is a vector processor comprising the processing pipelines 106 that are independent processing units, each processing pipeline 106 may independently execute a worker 112 instance. However, in case the processor(s) 104 incorporates the SIMD engine, the worker 112 may be executed by the processor(s) 104 that assigns data to each of the processing pipelines 106 of the SIMD engine. The processor(s) 104 may then initiate a single instruction to instruct all the processing pipelines 106 of the SIMD engine to concurrently execute the same operation (instruction), each processing pipeline 106 processing its respective assigned data.

As shown at 202, the process 200 starts with the coordinator 110 receiving the input data stream 120.

As shown at 204, the coordinator 110 splits the input data stream 120 to a plurality of data sub-streams and distributes them to a plurality of workers 112 each executed by a respective one of the processing pipelines 106. The number of the data sub-streams may be selected according to a number of available processing pipelines such as the processing pipelines 106. In case the process 200 is performed by the processor(s) 104 having the SIMD engine, the worker 110 is executed by the processor(s) 104 that assigns data of the respective data sub-stream to each of the processing pipelines 106 of the SIMD engine. The coordinator 110 splits the input data stream 120 such that each pair of consecutive data sub-streams has an overlapping portion with an adjacent data sub-stream, i.e. a preceding data sub-stream and/or succeeding data sub-stream. The coordinator 110 may set the size of the overlapping portion to best accommodate one or more segmentation techniques used by the worker(s) 110 to segment each of the plurality of the data sub-streams as described hereinafter.

Figure 3:
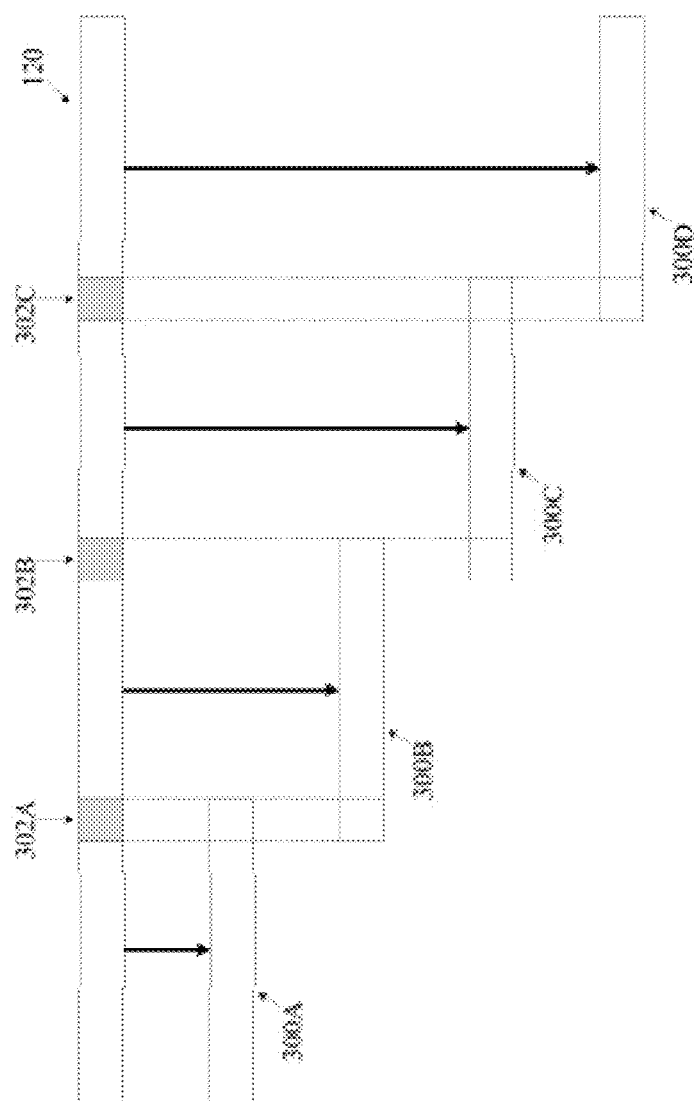
FIG. 3 is a schematic illustration of an exemplary process of splitting an input data stream to a plurality of sub-streams, according to some embodiment of the present disclosure.

Reference is now made to FIG. 3, which is a schematic illustration of an exemplary process of splitting an input data stream to a plurality of sub-streams, according to some embodiment of the present disclosure. A coordinator such as the coordinator 110 receives an exemplary input data stream such as the input data stream 120 and processed by a plurality of worker(s) such as the worker 112. The coordinator 110 splits the input data stream 120, for example, to four data sub-streams 300A, 300B, 300C and 300D. The number of the data sub-streams described herein is arbitrary selected. The number of the data sub-streams may be selected according to a number of available processing pipelines such as the processing pipelines 106, for example, 4, 8, 16, 64, 128, 256 and/or 256. Moreover, with the advancement of processor technology the number of the processing pipelines 106 capable of parallel processing constantly increases thus the number of the data sub-streams may increase accordingly. It is expected that in most cases (i.e. a sufficiently large input data stream 120), the segmentation performance is increased with the increase of processing pipelines. The coordinator 110 splits the input data streams 120 such that each of the input data streams 300A, 300B, 300C and 300D has an overlapping portion with an adjacent preceding and/or succeeding data sub-stream 300A, 300B, 300C and/or 300D. For example, the data sub-stream 300A has an overlapping portion 302A with the data sub-stream 300B, the data sub-stream 300B has an overlapping portion 302B with the data sub-stream 300C and the data sub-stream 300C has an overlapping portion 302C with the data sub-stream 300D. As evident, central data sub-streams such as, for example, the data sub-stream 300B and 300C each have two overlapping portions, a first overlapping portion such as 302A and 302B respectively with a preceding data-sub-stream, 300A and 300B respectively and a second overlapping portion such as 302B and 302C respectively with a succeeding data-sub-stream, 300C and 300D respectively. The coordinator 110 may select and/or adapt the size of the overlapping portion to best accommodate the segmentation technique(s) used to segment the data sub-streams 300A, 300B, 220C and 300D. Typically the size of the overlapping portion such as the overlapping portions 302A, 302B and/or 302B is selected to include several data segments (blocks), for example, 4, 8 and/or 16 segments. While most of the segmentation techniques may create variable size segments, the segments may maintain an average segments size, for example, 4 kilobytes (KB) which may vary between a pre-defined minimum segments size and a pre-defined maximum segments size.

Reference is made once again to FIG. 2. As shown at 206, the worker(s) 112 concurrently segment the data sub-streams 300A-300D. In case the processing pipelines 106 are each independently executing the worker 112, each of the workers 112 segments a respective more than one of the data sub-streams 300A-300D to create a respective more than one segmented data sub-streams. In case the processing pipelines 106 are SIMD processing pipelines, the processor(s) 104 executes the worker 112 which initiates a single instruction for the processing pipelines 106 of the SIMD engine to concurrently segment its respective data sub-stream 300A-300D. The workers 112 may use one or more of a plurality of segmentation techniques to segment the respective data sub-stream, for example, calculating rolling hash values for rolling sequences shifted over each of the data sub-streams and checking compliance of the rolling hash value with one or more segmentation criteria. The workers 112 may use other segmentation methods as is known in the art and/or yet to be known since any applicable segmentation technique may be applied for the process 200. For the processor(s) 104 having the SIMD engine, the worker 112 executed by the processor(s) 104 assigns each of the SIMD engine processing pipelines 106 with data of the respective one of the data sub-streams 300A-300D. The SIMD engine processing pipelines 106 concurrently segment the data sub-streams 300A-300D at a single instruction by the worker 112 (processor(s) 104).

Optionally, the worker(s) 112 start segmenting each of the data segments (blocks) with the pre-defined minimum size. When each of the workers 112 applies the rolling hash segmentation technique, the worker 112 starts calculating the hash value for data items following the pre-defined minimum size. Typically, for data deduplication, the size of the data segments may be, for example, 4 KB, 6 KB and/or 8 KB which may best fit current processing, storage and/or networking throughput and performance such that the overhead of processing the data segments is optimized with respect to the number of segments. Based on the typical segment size, the pre-defined minimum size may be for example, 2 KB.

Optionally, the worker(s) 112 apply a pre-defined maximum size to each of the data segments (blocks) in the segmented data sub-streams. When each of the workers 112 applies the rolling hash segmentation technique, the worker 112 may "cut", i.e. designate the data segment in case the pre-defined maximum size of data items is reached before the worker 112 detects compliance of the rolling hash value with the one or more segmentation criteria. Based on the typical segment size, the pre-defined maximum size may be for example, 16 KB.

As shown at 208, after the worker(s) 112 have completed segmenting their respective data sub-streams 300A-300D, the coordinator 110 synchronizes the data sub-streams 300A-300D to recover the original sequencing and order of the original input data stream 120. The coordinator 110 synchronizes the data sub-streams 300A-300D by analyzing the segmented overlapping portions 302A-302C shared by each pair of consecutive data sub-streams of the data sub-streams 300A-300D. Since all the worker(s) 112 use the same segmentation technique and the same segmentation criterion(s) to segment the data sub-streams 300A-300D, it is expected that the respective overlapping portions 302A-302C of each two adjacent segmented data sub-streams 300A-300D are segmented identically. The coordinator 110 may identify the identical segmentation area(s) among the consecutive data sub-streams 300A-300D to properly synchronize the segmentation of the data sub-streams 300A-300D.

As shown at 210, after the coordinator 110 synchronizes the segmented data sub-streams 300A-300D, the coordinator 110 joins together the segmented data sub-streams to create the complete segmented data stream 130 corresponding to the originally received input data stream 120.

Optionally, in case the coordinator 110 fails the synchronize the segmented data sub-streams 300A-300D, the coordinator 110 segments the input data stream 120, i.e. without splitting the input data stream 120 and employing the worker(s) 112 to concurrently segment the data sub-streams 300A-300D.

Figure 4:
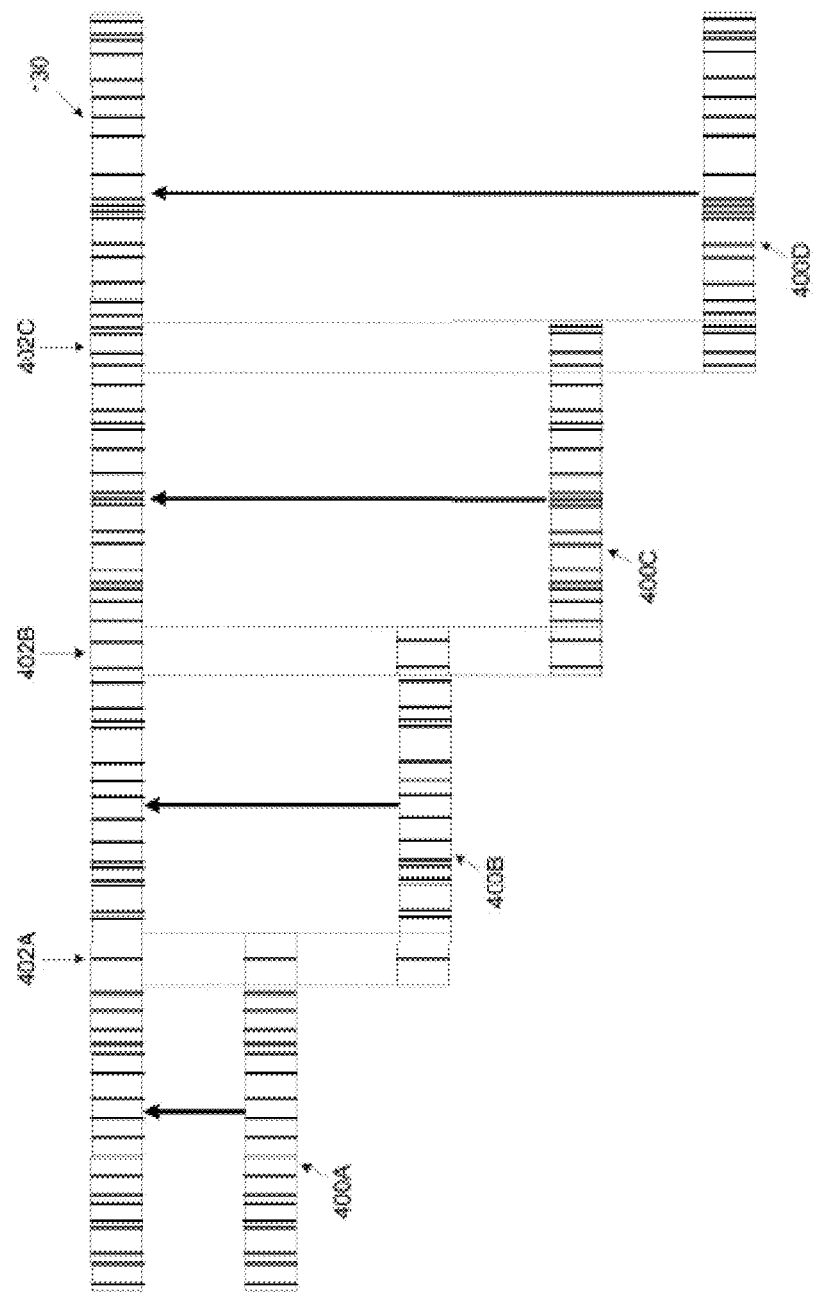
FIG. 4 is a schematic illustration of an exemplary process of joining a plurality of segmented data sub-streams to create a segmented data stream, according to some embodiment of the present disclosure.

Reference is now made to FIG. 4, which is a schematic illustration of an exemplary process of joining a plurality of segmented data sub-streams to create a segmented data stream, according to some embodiment of the present disclosure. In case a processor such as the processor(s) 104 comprises a plurality of independent processing pipelines, each processing pipeline executes an instance of a worker such as the worker 112. The plurality of workers such as the worker 112 segment their respective data sub-streams such as the data sub-streams 300A-300D to create corresponding segmented data sub-streams 400A, 400B, 400C and 400D. In case the processor(s) 104 has an SIMD engine, the worker 112 is executed by the processor(s) 104 that assigns each of the processing pipelines 106 of the SIMD engine with data of the respective one of the data sub-streams 300A-300D. The SIMD engine processing pipelines 106 may concurrently segment the data sub-streams 300A-300D at an instruction(s) of the worker 112 (executed by the processor(s) 104). After all the worker(s) 112 complete segmenting the data sub-streams 300A-300D and provide the respective segmented data sub-streams 400A-400D, a coordinator such as the coordinator 110 joins the segmented data-streams 400A-400D to create the segmented data stream 130 which corresponds to the input data stream 120. The coordinator 110 joins the segmented data sub-streams 400A-400D to maintain the order as in the original input data stream 120 by synchronizing the sequencing of the data items of segmented overlapping portions 402A, 402B and 402C which correspond to original overlapping portions such as the overlapping portions 302A, 302B and 302C respectively. Each adjacent pair of the segmented data sub-streams 400A-400D includes a respective segmented overlapping portion of the segmented overlapping portions 402A-402C. Since each of worker(s) 112 uses the same segmentation technique and the same segmentation criteria, the overlapping portion(s) 302A-302C are segmented identically. For example, the segmented overlapping portion 402A is identically segmented by both the processing pipeline 106 segmenting the segmented data sub-stream 400A and the processing pipeline 106 segmenting the segmented data sub-stream 400B. Similarly, the segmented overlapping portion 402B is identically segmented by both the processing pipeline 106 segmenting the segmented data sub-stream 400B and the processing pipeline 106 segmenting the segmented data sub-stream 400C. In the same way, the segmented overlapping portion 402C is identically segmented by both the processing pipeline 106 segmenting the segmented data sub-stream 400C and the processing pipeline 106 segmenting the segmented data sub-stream 400D.

The coordinator 110 joins the segmented data sub-streams 400A-400D to create the segmented data stream 130 by synchronizing the sequencing of the segmented data sub-stream 400A-400D based on the data segments identified in the each of the overlapping portions 402A-402C.

In some embodiments of the present disclosure, the segmentation of each of the data sub-streams is done by shifting a rolling sequence over each of the data sub-streams and calculating a rolling hash value. The rolling hash value is checked for compliance with one or more segmentation criteria to identify a data segment.

Before further presenting the embodiments utilizing the rolling hash segmentation, the segmentation process using rolling sequences and rolling hash is first described.

Figure 5:
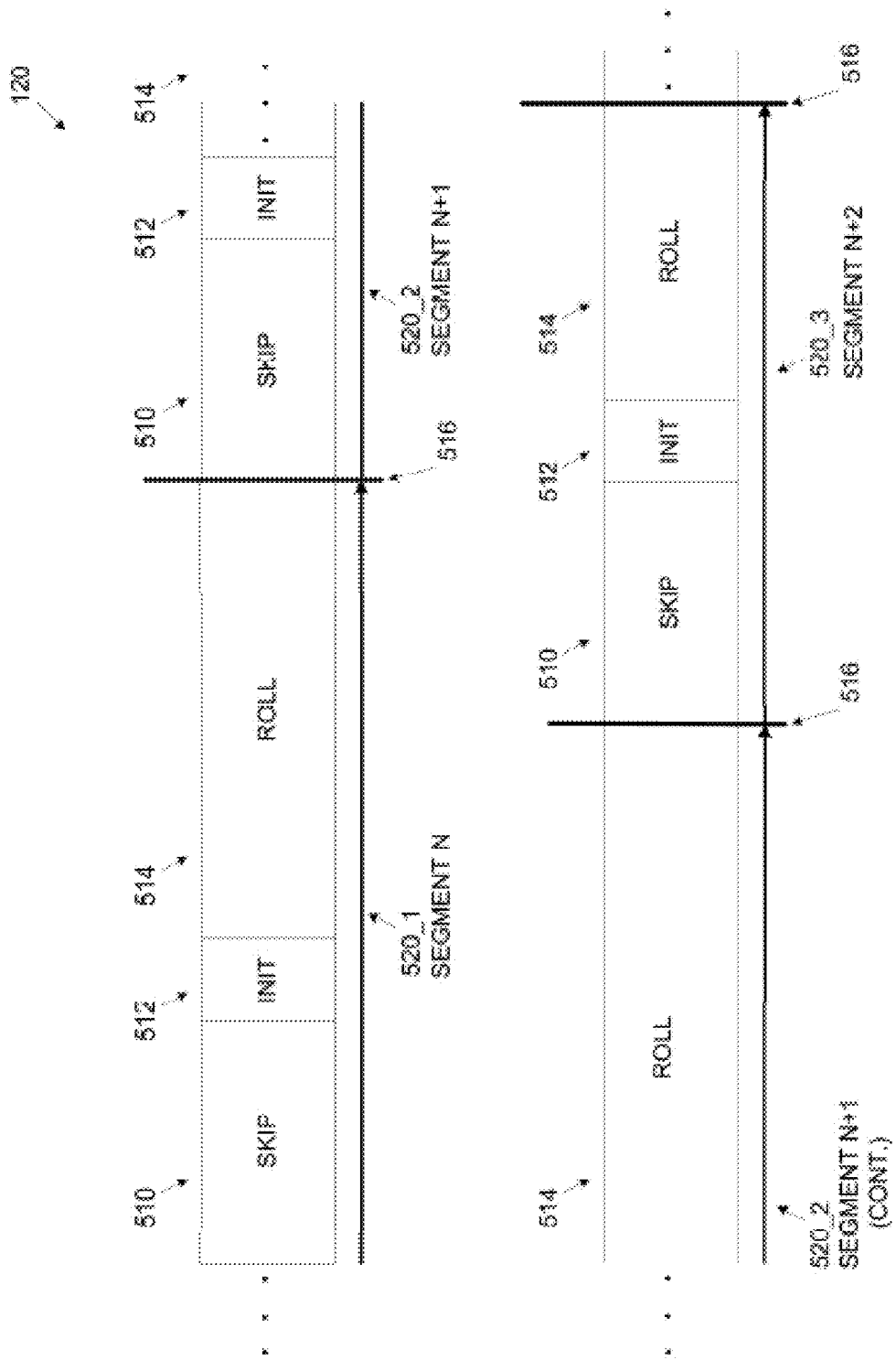
FIG. 5 is a schematic illustration of an exemplary process of segmenting an input data stream using rolling hash segmentation.

Reference is now made to FIG. 5, which is schematic illustration of an exemplary process of segmenting an input data stream using rolling hash segmentation. An input data stream such as the input data stream 120 is segmented to designate a plurality data segments (blocks) in the input data stream 120 to create a segmented data stream such as the segmented data stream 130. Detecting each of the segments includes 3 main steps, a skip 510, an initialization 512, a roll 514 and a cut 516. The skip 510 includes skipping a pre-defined minimum number of data items in the input data stream 120 such that each of the segments has a minimum size. The initialization 512 includes shifting through a pre-defined number of data items required to set a minimum data size for calculating a rolling hash value, for example, 16, 64 and/or 128 data items. The roll 514 includes calculating a rolling hash value for a rolling sequence shifted over the input data stream and comparing the calculated hash value to one or more segmentation criteria to detect a segment. When the hash value complies (satisfies) with the segmentation criteria, a cut 516 is made and the data segment which comprises the data items up to the point of the cut 516 is designated a segment. The segmentation process starts from the beginning of the input data stream 120 and starts over again with the skip 510, the initialization 512, the roll 514 and the cut 516 from the point of each cut, i.e. the end of a previous data segment to detect and designate a following data segment. The segmentation process is repeated throughout the input data stream 120 such that a plurality of data segments, such as the segments 520_1, 520_2 and 520_3 is designated in the input data stream 120 to create a segmented data stream 130.

Figure 6:
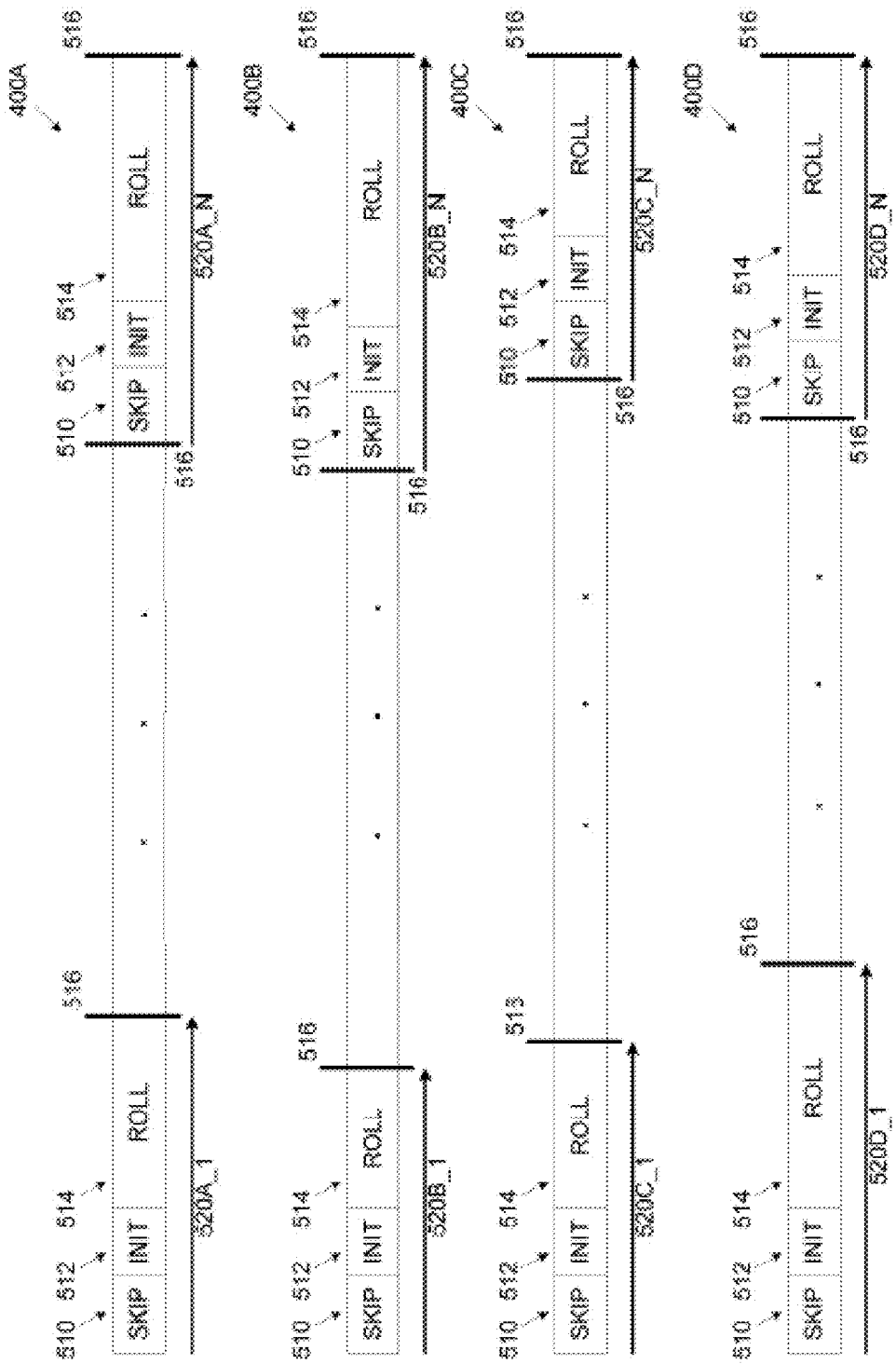
FIG. 6 is schematic illustration of an exemplary process for concurrently segmenting in parallel a plurality of data sub-streams using rolling hash segmentation, according to some embodiment of the present disclosure.

Reference is now made to FIG. 6, which is schematic illustration of an exemplary process for concurrently segmenting in parallel a plurality of data sub-streams using rolling hash segmentation, according to some embodiment of the present disclosure. A coordinator such as the coordinator 110 splits an input data stream such as the input data stream 120 to a plurality of data sub-streams, for example, 4 such as the data sub-streams 300A, 300B, 300C and 300D. In case a processor such as the processor(s) 104 comprises a plurality of independent processing pipelines, each processing pipeline executes an instance of a worker such as the worker 112. The plurality of workers such as the workers 112, for example, four concurrently segment the data sub-streams 300A, 300B, 300C and 300D concurrently using the rolling hash segmentation to create respective segmented data sub-streams such as the segmented data sub-streams 400A, 400B, 400C and 400D. Each of the workers 112 processes (segments) a respective one or more of the data sub-streams 300A, 300B, 300C and 300D. Each of the workers 112 applies the rolling hash segmentation technique (as described herein above) comprising a skip such as the skip 510, an initialization such as the initialization 512, a roll such as the roll 514 and a cut such as the cut 516. Since the rolling hash segmentation technique employs variable size segmentation, each of the workers 112 may detect a different size data segment such as for the respective data segments, for example, 520A_1, 520B_1, 520C_1 and/or 520D_1. After one of the workers 112 detects a data segment (compliance of the rolling hash value with the segmentation criteria) and designates the segment, the worker 112 repeats the process throughout its respective one of the data sub-streams 300A-300D. The workers 112 perform the segmentation process independently from each other and may therefore consume different processing time thus the segmentation processes carried out by the plurality of workers 112 may complete at the different time for each of the segmented data sub-streams 400A-400D. In case the processing pipelines 106 are SIMD engine processing pipelines 106, the worker 112 is executed by the processor(s) 104 that assigns each of the processing pipelines 106 of the SIMD engine with data of the respective one of the data sub-streams 300A-300D. The SIMD engine processing pipelines 106 may concurrently segment the data sub-streams 300A-300D at an instruction(s) of the worker 112 (executed by the processor(s) 104). The SIMD engine processing pipelines 106 process concurrently their respective data until one of the SIMD engine processing pipelines 106 detects a cut 516. At that point, the worker 112 (executed by the processor(s) 104) may stop all the SIMD engine processing pipelines 106 since all SIMD engine processing pipelines 106 need to execute the same instruction of the worker 112. The worker 112 may serially process the respective data sub-stream of the SIMD engine processing pipeline 106 that detected the cut 516 by completing the skip 510 and the initialization 512 before instructing all the SIMD engine processing pipelines 106 to resume the roll 514.

Reference is now made to FIG. 7A, FIG. 7B, FIG. 7C, FIG. 7D, FIG. 7E, FIG. 7F, FIG. 7G, FIG. 7H, FIG. 7I, FIG. 7J, FIG. 7K, FIG. 7L and FIG. 7M which are schematic illustrations of an exemplary process for concurrently segmenting in parallel a plurality of data sub-streams at varies points in time, according to some embodiment of the present disclosure. A coordinator such as the coordinator 110 first splits an input data stream such as the input data stream 120 to a plurality of data sub-streams, for example, 4 such as the data sub-streams 300A, 300B, 300C and 300D. A plurality of processing pipeline such as the workers 112, for example, four concurrently segment the data sub-streams 300A, 300B, 300C and 300D in parallel using the rolling hash segmentation technique to create respective segmented data sub-streams such as the segmented data sub-streams 400A, 400B, 400C and 400D. As described herein above the processing pipeline 106 may be independent processing pipelines and/or processing pipelines of an SIMD processor and/or engine. Each of the processing pipeline 106 segments (processes) a respective on of the data sub-streams 300A-300D. Each of the processing pipeline 106 applies the rolling hash segmentation comprising a skip such as the skip 510, an initialization such as the initialization 512, a roll such as the roll 514 and a cut such as the cut 516 to a respective one of the data sub-streams 300A-300D.

FIG. 7A through 7M present a concurrent segmentation progress done by four workers 112 each executed by one of four processing pipelines 106. The workers 112 segment concurrently and independently the data sub-streams in streams 300A-300D to create the segmented data sub-streams 400A-400D.

Figure 7A:
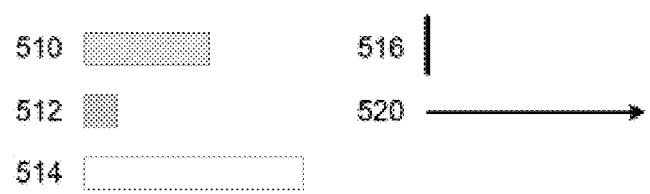
FIG. 7A is a schematic illustration of an exemplary process for concurrently segmenting in parallel a plurality of data sub-streams at a 1st point in time, according to some embodiment of the present disclosure.
Figure 7A:
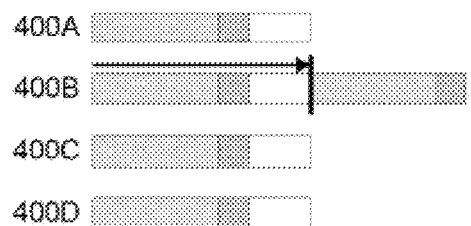
Figure 7B:
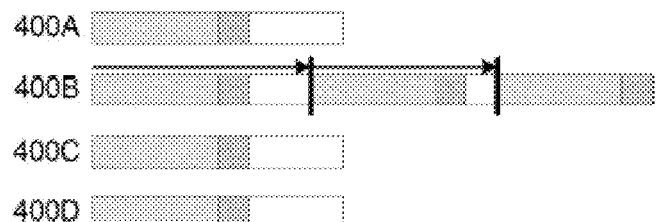
FIG. 7B is a schematic illustration of an exemplary process for concurrently segmenting in parallel a plurality of data sub-streams at a 2nd point in time, according to some embodiment of the present disclosure.
Figure 7C:
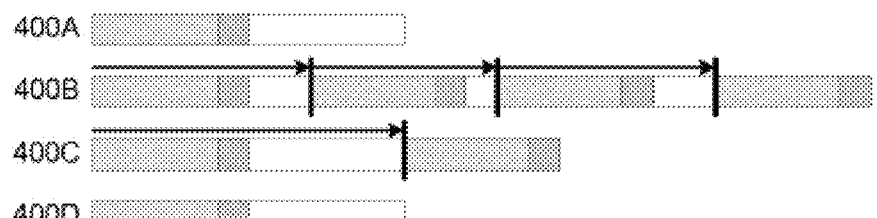
FIG. 7C is a schematic illustration of an exemplary process for concurrently segmenting in parallel a plurality of data sub-streams at a 3rd point in time, according to some embodiment of the present disclosure.

As seen in FIG. 7A, the four data sub-streams 300A-300D are segmented at the same time with the skip 510, initialization 512 and rolling calculation 514. The processing pipeline 106 segmenting the segmented data sub-stream 400B is the first to detect a data segment and cut 516 the sequence to designate a segment 520. Following the cut 516 the processing pipeline 106 segmenting the segmented data sub-stream 400B moves on to perform the skip 510 and the initialization 512 for the following data segment starting at the end of the designated data segment. As seen in FIG. 7B, while the processing pipeline 106 processing the segmented data sub-stream 400A, 400C and 400D are still executing the roll 514, the v segmenting the segmented data sub-stream 400B detects a second data segment and cuts 516 the sequence to designate the segment 520. As seen in FIG. 7C, while the v processing the segmented data sub-stream 400A and 400D are still executing the roll 514, the two processing pipelines 106 segmenting the segmented data sub-stream 400B and 400C detect a third data segment and a first data segment respectively and cut 516 the sequences to designate the segments 520. The processing pipelines 106 advance with the segmentation process as presented in the FIG. 7D through FIG. 7M to create the segmented data sub-streams 400A-400D. As seen in FIG. 7H, the processing pipeline 106 processing the segmented data sub-stream 400B reaches the end of the segmented data sub-stream 400B and completes the segmentation process. Once completing the segmentation sequence, the processing pipeline 106 which created the segmented data sub-stream 400B halts and waits for the other processing pipelines 106 to complete the segmentation of the other segmented data sub-streams 400A, 400C and 400D.

As described herein above, for processing pipelines 106 of the SIMD engine, when one of the processing pipelines 106 detects the cut 516 and designates the segment 520, the roll 514 at all the other processing pipelines 106 is paused until the processing pipeline 106 that made the cut 516 completes the skip 510 and the initialization 512. After the detecting processing pipeline 106 that made the cut 516 completes the skip 510 and the initialization 512, the worker 112 (executed by the processor(s) 104) may instruct all the processing pipelines 106 of the SIMD engine to resume the roll 514. As seen in FIG. 7L, the workers 112 processing the segmented data sub-streams 400C and 400D also complete the segmentation process and halt. As seen in FIG. 7M, the processing pipeline 106 processing the segmented data sub-stream 400A finally completes the segmentation process and halts. Once all the processing pipelines 106 complete segmenting the respective segmented data sub-streams 400A-400D the coordinator 110 may join the 400A-400D by synchronizing segmented overlapping such as the segmented overlapping portions 402A-402C to create the segmented data sub-stream 130.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant vector processing technologies such as SIMD will be developed and the scope of the term SIMD is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub combination or as suitable in any other described embodiment of the disclosure. Certain features described in the context of various embodiments are not to be considered essential features of those embodiments, unless the embodiment is inoperative without those elements.

What is claimed is:

1. A computing system for segmenting an input data stream, comprising:
a vector processor including a plurality of processing pipelines, the vector processor configured to:
split an input data stream to a plurality of data sub-streams, wherein each data sub-stream of the plurality of data sub-streams has an overlapping portion that overlaps with another data sub-stream of the plurality of data sub-streams;

create a plurality of segmented data sub-streams by concurrently segmenting each of the data sub-streams of the plurality of data sub-streams into a corresponding processing pipeline of the plurality of processing pipelines of the vector processor; and join the segmented data sub-streams in the plurality of segmented data sub-streams to create a segmented data stream by synchronizing a sequencing of the segmented data sub-streams in the plurality of segmented data sub-streams according to at least one overlapping portion of two data sub-streams.

2. The computing system according to claim 1, wherein the vector processor is a single-instruction-multiple-data (SIMD) processor.

3. The computing system according to claim 1, wherein each data sub-stream of the plurality of data sub-streams includes data items, and the vector processor is further configured to:

for each data sub-stream of the plurality of data sub-streams, segment the data sub-stream by calculating a rolling hash value for a rolling sequence applied over each data sequence of a plurality of data sequences of consecutive data items of the data sub-stream, and designate each of the plurality of data sequences as a variable size segment when the rolling hash value complies with at least one segmentation criterion, wherein the rolling sequence comprises a subset of consecutive data items of a respective data sequence.

4. The computing system according to claim 3, wherein each of the plurality of data sequences includes a pre-defined minimum number of the consecutive data items.

5. The computing system according to claim 3, wherein the vector processor is further configured to:

designate at least one large sequence of the plurality of data sequences as the variable size segment in response to determining that a number of the consecutive data items of the at least one large sequence exceeds a pre-defined maximum value before detecting compliance of the rolling hash value with the at least one segmentation criterion.

6. The computing system according to claim 1, wherein the vector processor is further configured to:

sequentially segment the input data stream in response to determining that the synchronizing the sequencing of the segmented data sub-streams fails.

7. A method for segmenting an input data stream, comprising:

splitting an input data stream to a plurality of data sub-streams, wherein each data sub-stream of the plurality of data sub-streams has an overlapping portion that overlaps with a data sub-stream of the plurality of data sub-streams;

creating a plurality of segmented data sub-streams by concurrently segmenting each of the data subs-streams of the plurality of data sub-streams into a corresponding processing pipeline of a plurality of processing pipelines of a vector processor; and joining the segmented data sub-streams in the plurality of segmented data sub-streams to create a segmented data stream by synchronizing a sequencing of the segmented data sub-streams in the plurality of segmented data sub-streams according to at least one overlapping portion of two data sub-streams.

8. The method according to claim 7, wherein the vector processor is a single-instruction-multiple-data (SIMD) processor.

9. The method according to claim 7, wherein each data sub-stream of the plurality of data sub-streams includes data items, and the method further comprises:

for each data sub-stream of the plurality of data sub-streams, segmenting the data sub-stream by calculating a rolling hash value for a rolling sequence applied over each data sequence of a plurality of data sequences of consecutive data items of the data sub-stream, and designating each of the plurality of data sequences as a variable size segment when the rolling hash value complies with at least one segmentation criterion, wherein the rolling sequence comprises a subset of consecutive data items of a respective data sequence.

10. The method according to claim 9, wherein each of the plurality of data sequences includes a pre-defined minimum number of the consecutive data items.

11. The method according to claim 9, further comprising:

designating at least one large sequence of the plurality of data sequences as the variable size segment in response to determining that a number of the consecutive data items of the at least one large sequence exceeds a pre-defined maximum value before detecting compliance of the rolling hash value with the at least one segmentation criterion.

12. The method according to claim 7, wherein the input data stream is sequentially segmented in response to determining that the synchronizing the sequencing of the segmented data sub-streams fails.

13. A non-transitory computer readable storage medium storing instructions that, when executed, cause a vector processor to segment an input data stream, by performing the steps of:

splitting an input data stream to a plurality of data sub-streams, wherein each data sub-stream of the plurality of data sub-streams has an overlapping portion that overlaps with a data sub-stream of the plurality of data sub-streams;

creating a plurality of segmented data sub-streams by concurrently segmenting each of the data subs-streams of the plurality of data sub-streams into a corresponding processing pipeline of a plurality of processing pipelines of a processor; and joining the segmented data sub-streams in the plurality of segmented data sub-streams to create a segmented data stream by synchronizing a sequencing of the segmented data sub-streams in the plurality of segmented data sub-streams according to at least one overlapping portion of two data sub-streams.

14. The computer readable storage medium according to claim 13, wherein the vector processor is a single-instruction-multiple-data (SIMD) processor.

15. The computer readable storage medium according to claim 13, wherein each data sub-stream of the plurality of data sub-streams includes data items, and the steps further comprise:

for each data sub-stream of the plurality of data sub-streams, segmenting the data sub-stream by calculating a rolling hash value for a rolling sequence applied over each data sequence of a plurality of data sequences of consecutive data items of the data sub-stream, and designating each of the plurality of data sequences as a variable size segment when the rolling hash value complies with at least one segmentation criterion, wherein the rolling sequence comprises a subset of consecutive data items of a respective data sequence.

16. The computer readable storage medium according to claim 15, wherein each of the plurality of data sequences includes a pre-defined minimum number of the consecutive data items.

17. The computer readable storage medium according to claim 15, wherein the steps further comprise:
designating at least one large sequence of the plurality of data sequences as the variable size segment in response to determining that a number of the consecutive data items of the at least one large sequence exceeds a pre-defined maximum value before detecting compliance of the rolling hash value with the at least one segmentation criterion.

18. The computer readable storage medium according to claim 13, wherein the input data stream is sequentially segmented in response to determining that the synchronizing the sequencing of the segmented data sub-streams fails.

\* \* \* \* \*